(12) United States Patent
Park et al.

(10) Patent No.: US 6,319,768 B1
(45) Date of Patent: Nov. 20, 2001

(54) METHOD FOR FABRICATING CAPACITOR IN DRAM CELL

(75) Inventors: Kun Sik Park, Taejon-si; Wouns Yang, Chungcheongbuk-do, both of (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/357,935

(22) Filed: Jul. 21, 1999

(30) Foreign Application Priority Data

Sep. 4, 1998 (KR) .................................................. 98-36576

(51) Int. Cl.$^7$ ................................................. H01L 21/8242
(52) U.S. Cl. .......................... 438/253; 438/396; 438/672; 438/626; 438/256
(58) Field of Search .................................... 438/253, 396, 438/672, 626, 254, 241, 243, 256

(56) References Cited

U.S. PATENT DOCUMENTS

| 6,010,933 | * | 1/2000 | Cherng | 438/396 |
| 6,025,227 | * | 2/2000 | Sung | 438/253 |
| 6,168,987 | * | 1/2001 | Jeng et al. | 438/253 |
| 6,177,307 | * | 1/2001 | Tu et al. | 438/241 |

* cited by examiner

Primary Examiner—Charles Bowers
Assistant Examiner—Yennhu B. Huynh

(74) Attorney, Agent, or Firm—Morgan, Lewis & Bockius LLP

(57) ABSTRACT

A method for fabricating a capacitor in a DRAM cell, includes the steps of: forming a plurality of wordlines each having a first cap insulating film on a semiconductor substrate; forming source/drain impurity regions in an active region of the semiconductor substrate on both sides of each of the wordlines; forming first sidewall insulating films at the both sides of said each of the wordlines; forming first plugs for contacting either capacitor nodes or bitlines on each of the source/drain impurity regions; forming an interlayer insulating film on the semiconductor substrate and forming a contact hole to the first plugs for contacting to the bitlines therein; forming a plurality of bitlines in a direction perpendicular to the wordlines, each of the bitlines being in contact with the first plugs, and having a second cap insulating film; forming second sidewall insulating films at both sides of each of the bitlines and selectively removing the interlayer insulating film to expose surfaces of the first plugs; forming second plugs on the first plugs for contacting the capacitor nodes; removing the second cap insulating film to a required depth; forming capacitor storage electrodes on the second plugs and the second sidewall insulating films, wherein the capacitor storage electrodes are formed by sputtering a conductive layer on an entire surface of the semiconductor substrate and subjecting the conductive layer to an anisotropic etching to remove the conductive layer on the second cap insulating films; and forming a dielectric film and a plate electrode on the semiconductor substrate.

10 Claims, 11 Drawing Sheets

METHOD FOR FABRICATING CAPACITOR IN DRAM CELL

This Application claims the benefit of Korean Application No. 36576/1998 filed on Sep. 4, 1998, which is hereby incorporated by reference.

BACKGROUND OF THE INVENTION

1. Field of the Invention

The present invention relates to a method for fabricating a semiconductor device, and more particularly, to a method for fabricating a capacitor in a highly integrated DRAM cell.

2. Background of the Related Art

As semiconductor memories are developed from mega class to giga class, the cell size reduces and the semiconductor fabrication process gets very complicated. A related art method for fabricating a capacitor in a giga class DRAM cell will be explained in detail with reference to the attached drawings. FIGS. 1a~1d illustrate plan views of DRAM cells showing the steps of the related art process for fabricating a capacitor in the DRAM cell, and FIGS. 2a~2e illustrate section views across lines I–I' showing the steps of the related art process for fabricating a capacitor in the DRAM cell.

Referring to FIGS. 1a and 2a, an active region 2 and a field region (i.e., a region excluding a the active region 2) are first defined on a semiconductor substrate 1 and a field oxide film 3 is formed on the field region. A plurality of wordlines (i.e., gate electrodes) 4 and cap insulating films (not shown) are formed on the semiconductor substrate 1 perpendicular to the active region 2 at fixed intervals such that every action region 2 has two wordlines passing across the active region 2. The wordlines 4 are used as masks in injecting impurity ions into the active region 2 to form source/drain impurity regions (not show). Sidewall insulating films 5 are formed at both sides of the wordlines 4.

As shown in FIGS. 1b and 2b, polysilicon is deposited on an entire surface of the substrate, and then selectively removed by a chemical mechanical polishing process (CMP) to expose a surface of the cap insulating film on the wordline. The polysilicon layer is then subjected to patterning by photolithography, and a plurality of first plugs 6 and 6a are formed on the active region 2 between wordlines 4. As shown in FIG. 1b, the first plug 6a formed between two adjacent wordlines 4 in each active region is extended to portions at which a bitline is to be formed.

As shown in FIGS. 1c and 2c, a thick interlayer dielectric film (ILD) (e.g., a thick oxide film) 7 is formed on an entire surface, and then planarized. A contact hole 8 is then formed in a portion of the first plug 6a which is extended to the bitline. A tungsten layer and a cap insulting film are deposited on the entire surface of the substrate, subjected to patterning by photo etching to form a bitline 9 and a cap insulating film 10 in a direction perpendicular to the wordline. An insulating film is deposited on the entire surface, and etched back to form insulating sidewalls 11 at both sides of the bitline 9, and to expose surfaces of the first plugs 6 and 6a by making a slight over etching of the insulating film in the etch back of the insulating film such that the interlayer dielectric film 7 on the first plugs 6 and 6a is partially removed.

As shown in FIGS. 1d and 2d, polysilicon is deposited on an entire surface, removed by CMP to expose a surface of the cap insulating film 10 on the bitline 9. The polysilicon layer is then subjected to patterning by photolithography to leave the polysilicon only on the first plug 6, thus forming a second plug 12. Referring to FIG. 2e, a storage electrode 13 of a capacitor is formed on the second plug 12. A dielectric film 14 is formed on a surface of the capacitor storage electrode 13, and a plate electrode 15 is then formed on the dielectric film 14, thus completing a capacitor.

The related art method for fabricating a capacitor in a DRAM cell has the following problems. Because two plugs are formed, the related art method has many fabrication steps. In addition, the storage electrode of the capacitor has to be patterned by photolithography. This further complicates the fabrication process.

SUMMARY OF THE INVENTION

Accordingly, the present invention is directed to a method for fabricating a capacitor in a DRAM cell that substantially obviates one or more of the problems due to limitations and disadvantages of the related art.

An object of the present invention is to provide a method of forming a capacitor in a DRAM cell so that the storage electrode of the capacitor is formed without using a photolithography process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a capacitor in a DRAM cell includes the steps of (1) forming a plurality of wordlines each having a cap insulating film on a semiconductor substrate, (2) forming source/drain impurity regions in an active region of the semiconductor substrate on both sides of the wordline, (3) forming first sidewall insulating films at both sides of each of the wordlines, (4) forming a first plug for contact to a capacitor node and a first plug for contact to a bitline on each of the source/drain impurity regions, (5) forming an interlayer insulating film on an entire surface and forming a contact hole to the first plug for contact to the bitline therein, (6) forming a plurality of bitlines in a direction perpendicular to the wordlines, each of the bitlines being in contact with the first plug for contact to the bitline, and having a first cap insulating film, (7) forming second sidewall insulating films at both sides of the bitline and selectively removing the interlayer insulating film to expose a surface of the first plug, (8) forming a second plug on the first plug for contact to a capacitor node, (9) removing the second cap insulating film to a required depth, (10) forming a capacitor storage electrode on the second plug and the second sidewall insulating film, and (11) forming a dielectric film and a plate electrode on an entire surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3a–3h and 4a–4d illustrate section views showing the steps of a process for fabricating a capacitor in a DRAM cell in accordance with a preferred embodiment of the present invention. The plan views of the DRAM cell showing the steps of the process for fabricating the capacitor in accordance with the present invention are similar to FIGS. 1a–1d.

Figure 1A:
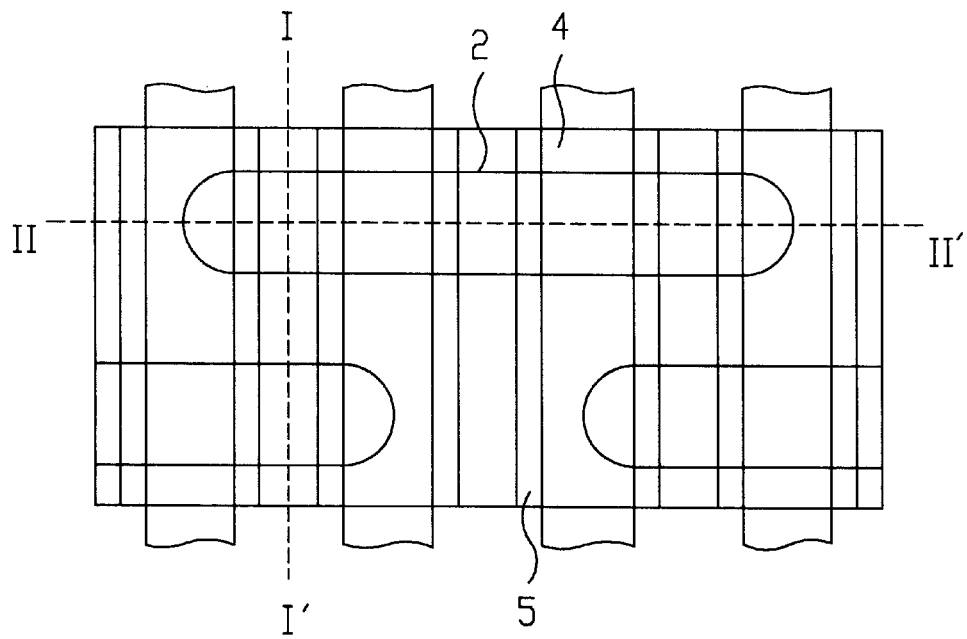
FIGS. 1a–1d illustrate plan views of a DRAM cell showing the steps of a related art process for fabricating a capacitor in the DRAM cell.
Figure 3A:
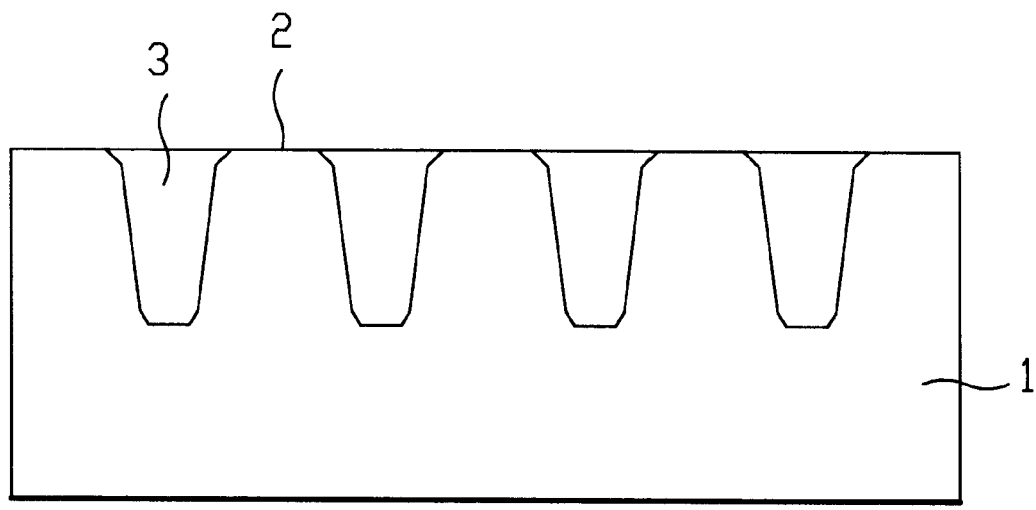
FIGS. 3a–3h illustrate section views showing the steps of a process for fabricating a capacitor in a DRAM cell in accordance with a preferred embodiment of the present invention.
Figure 4A:
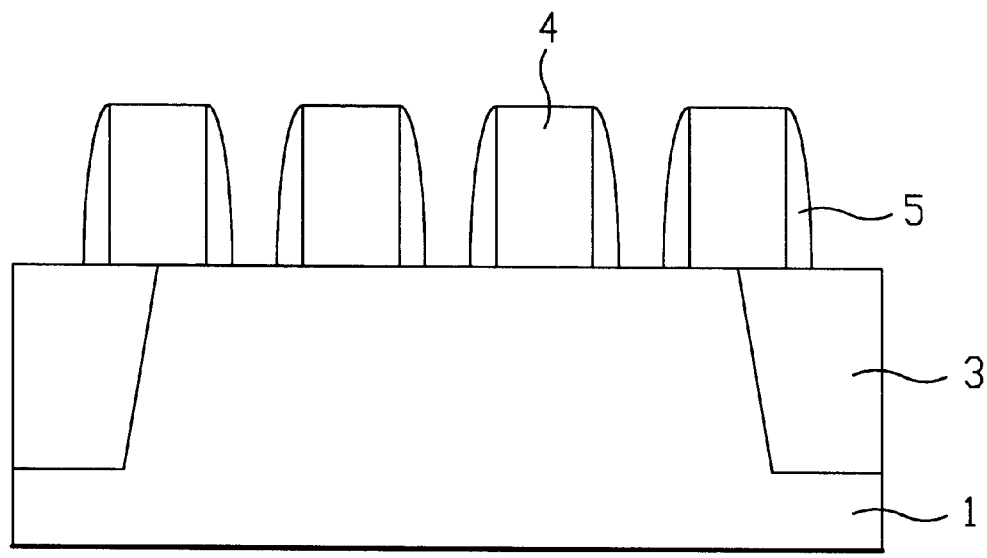
FIGS. 4a–4d illustrates section views across lines II–II' showing the steps of a process for fabricating a capacitor in a DRAM cell in accordance with a preferred embodiment of the present invention.
Figure 4B:
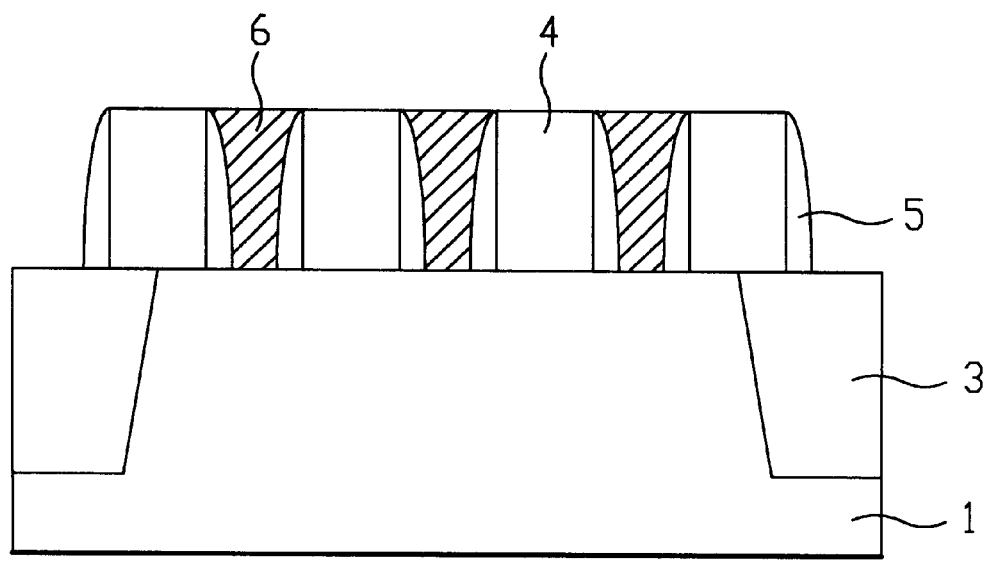
Figure 4C:
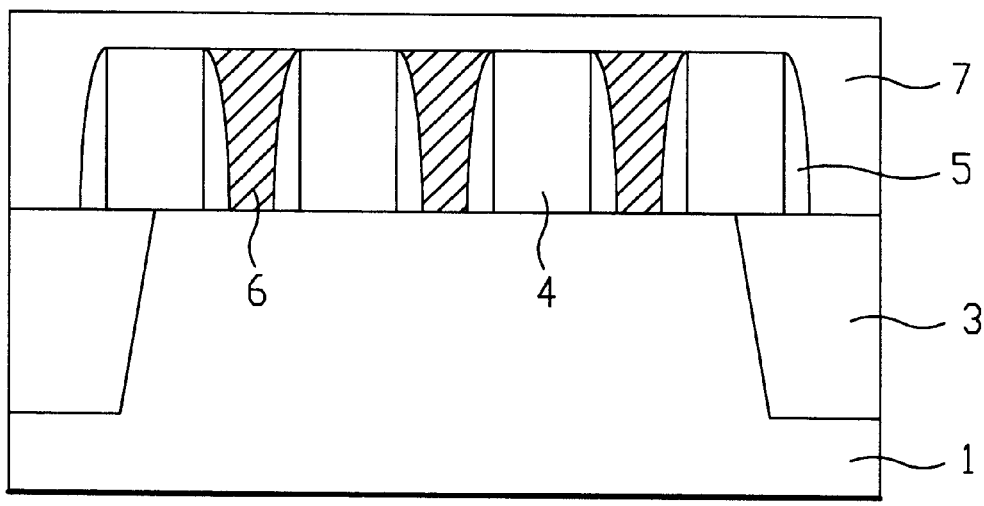
Figure 4D:
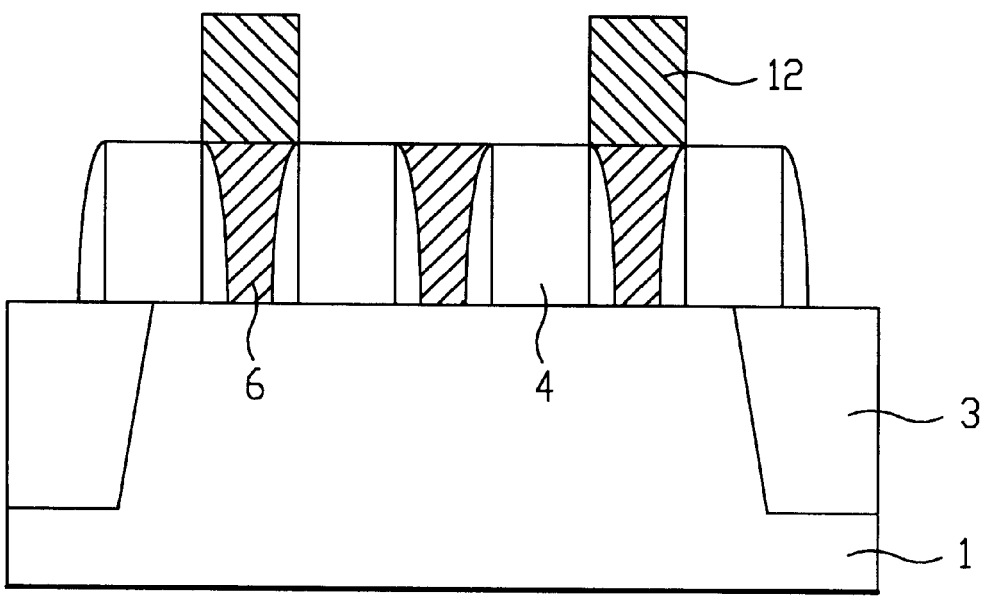

Referring to FIGS. 1a and 3a, an active region 2 and a field region (a region excluding the active region 2) are defined on a semiconductor substrate 1, and a field oxide film 3 is then formed on the field region. A plurality of wordlines (gate electrodes) 4 and cap insulating films (not shown) are formed on the semiconductor substrate 1 perpendicular to the active region 2 at fixed intervals, with two wordlines 4 crossing one active region 2. The wordlines 4 are used as masks in injecting impurity ions into the active region 2 to form source/drain impurity regions (not shown). As shown in FIG. 4a, sidewalls insulating films 5 are formed at both sides of each wordline 4.

Figure 1B:
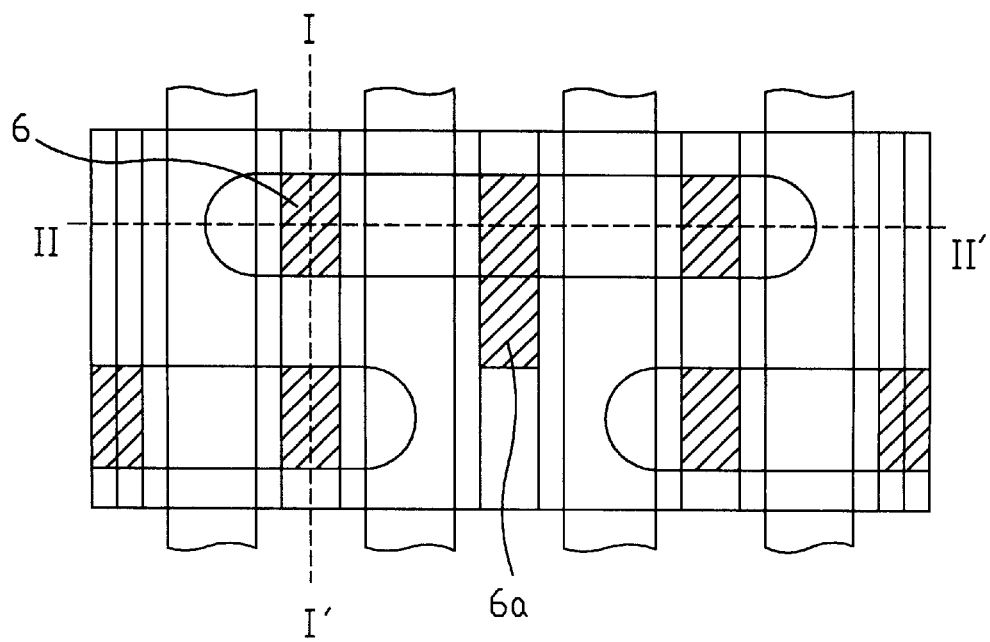
Figure 3B:
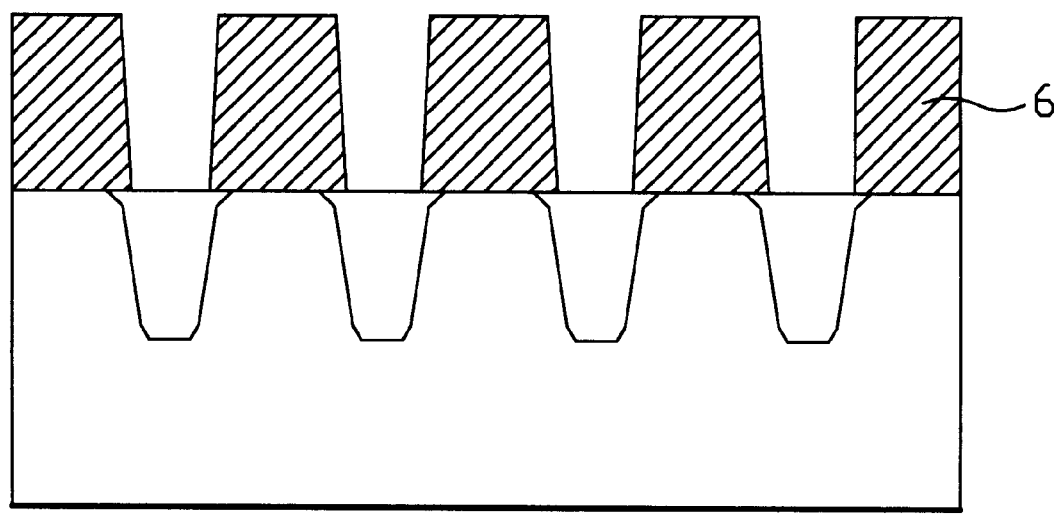

Referring to FIGS. 1b and 3b, polysilicon is deposited on an entire surface of the substrate, and then selectively removed by CMP to expose a surface of the cap insulating film on the wordline. The polysilicon layer is also subjected to patterning by a photolithography process to form a plurality of first plugs 6 and 6a on the active region 2 between the wordlines 4. Of the. plurality of first plugs 6 and 6a, as shown in FIG. 1b, the first plug 6a is formed to extend to portions at which bitlines are to be formed. Though not shown, a silicide layer may be formed on a surface of the first plugs 6 and 6a for reducing a contact resistance between the first plugs and second plugs which will be formed later.

Figure 1C:
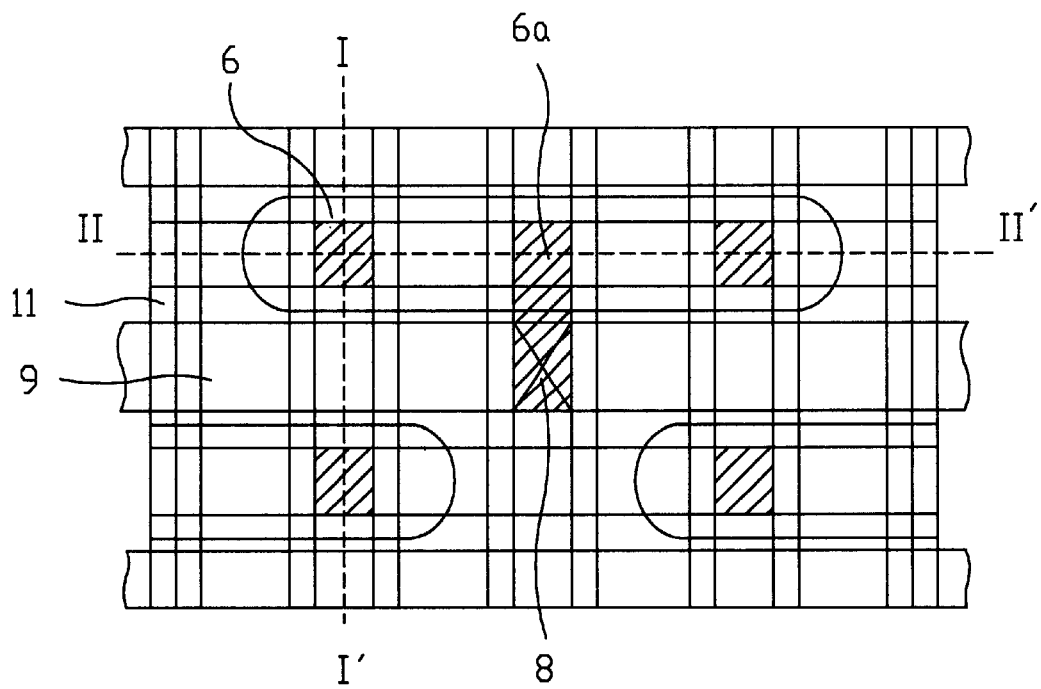
Figure 3C:
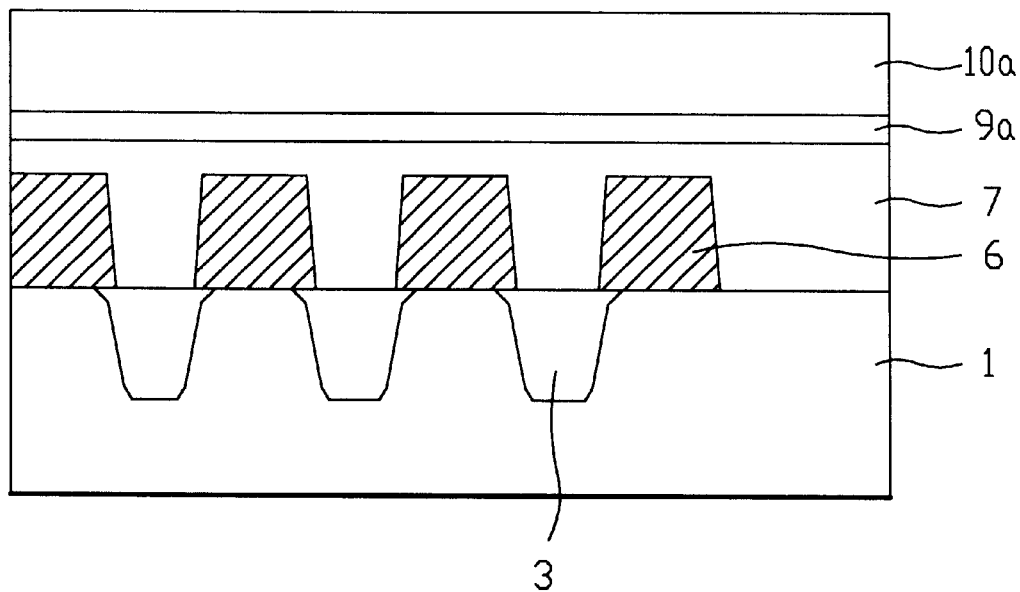

As shown in FIGS. 1c and 3c, a thick interlayer dielectric film (ILD) 7 is deposited on an entire surface and then planarized. A contact hole 8 is formed in a portion of the first plug 6a extended to the bitlines. A tungsten layer 9a is deposited on the entire surface, and a thick oxide film 10a is deposited on the tungsten layer 9a. As the oxide film 10a is to serve as a cap insulting film and will be partially removed to a required depth later, the oxide film 10a should be thick enough to insulate the bitline even after it is partially removed to a required depth.

Figure 1D:
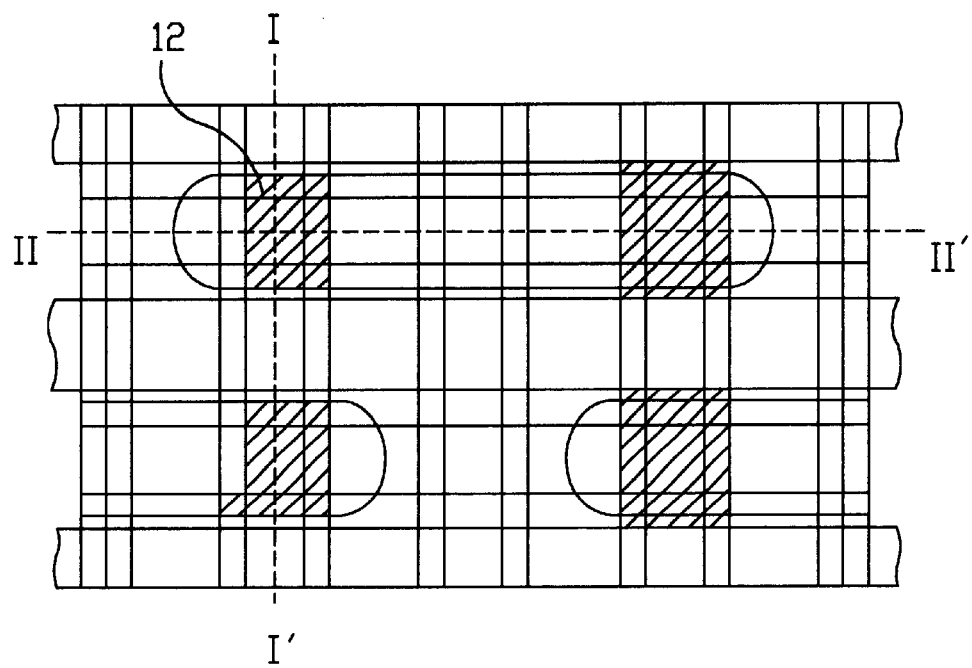
Figure 2A:
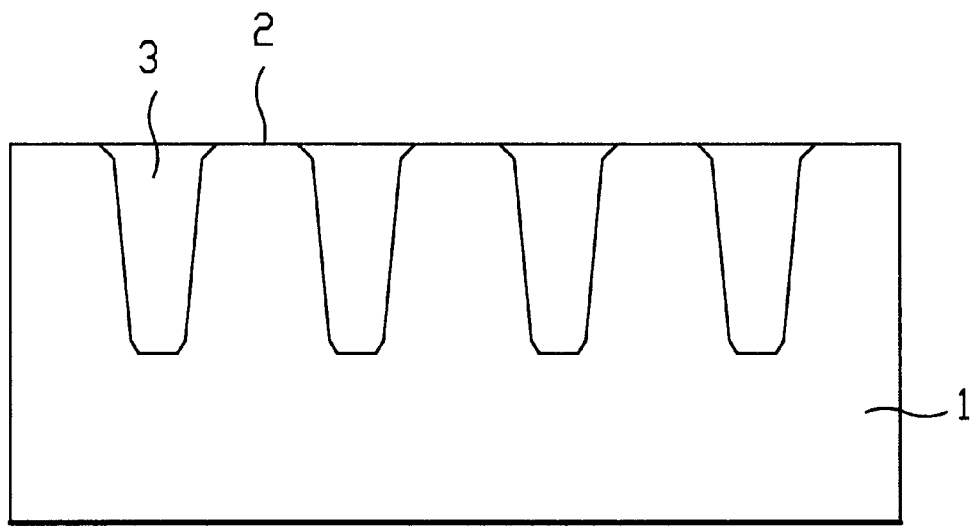
FIGS. 2a–2e illustrates section views across lines I–I' showing the steps of the related art process for fabricating a capacitor in the DRAM cell.
Figure 2B:
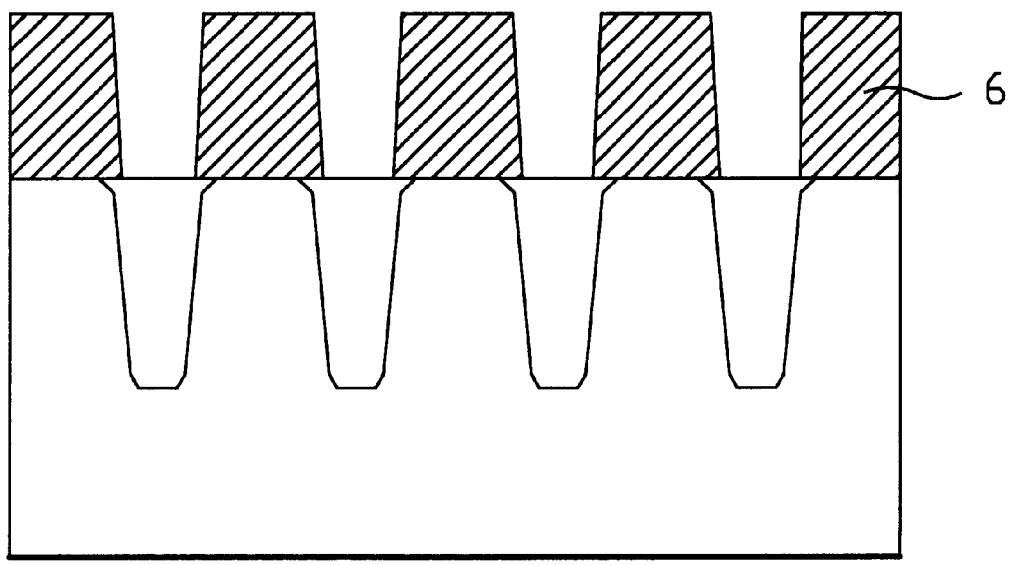
Figure 2C:
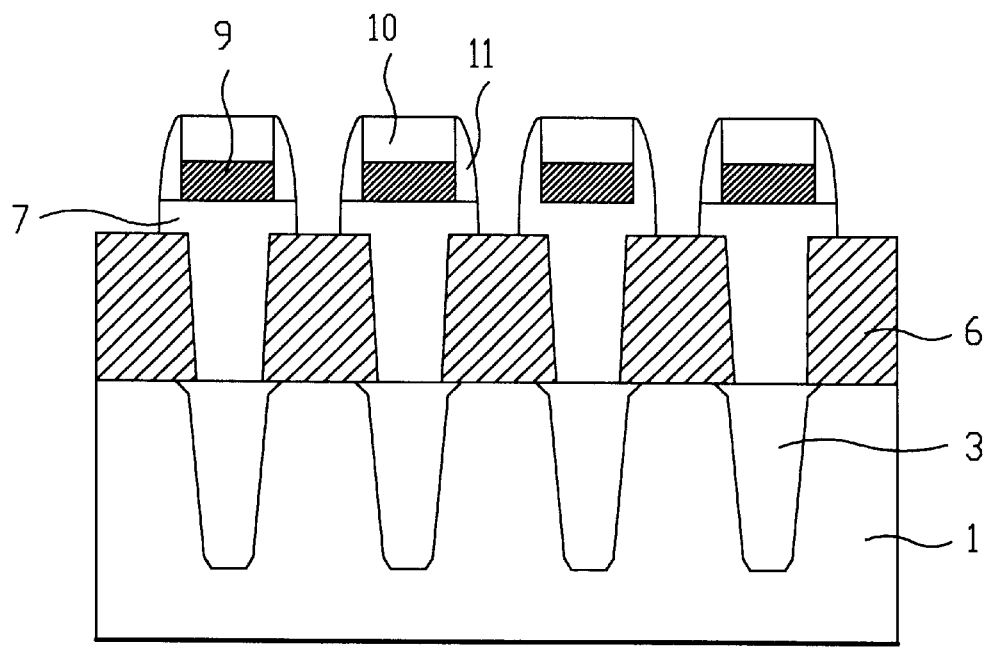
Figure 2D:
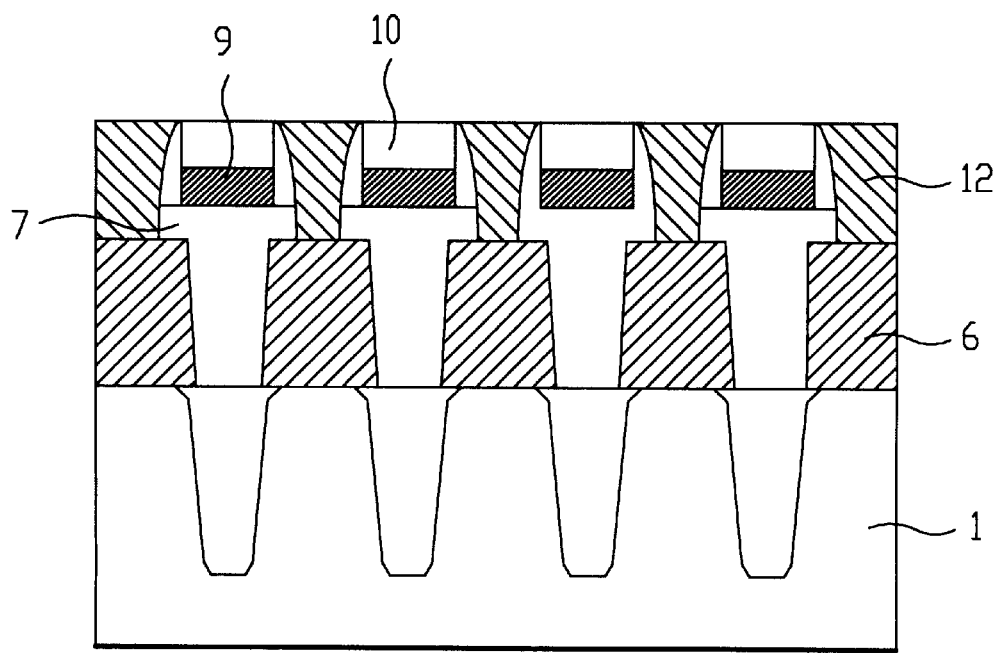
Figure 2E:
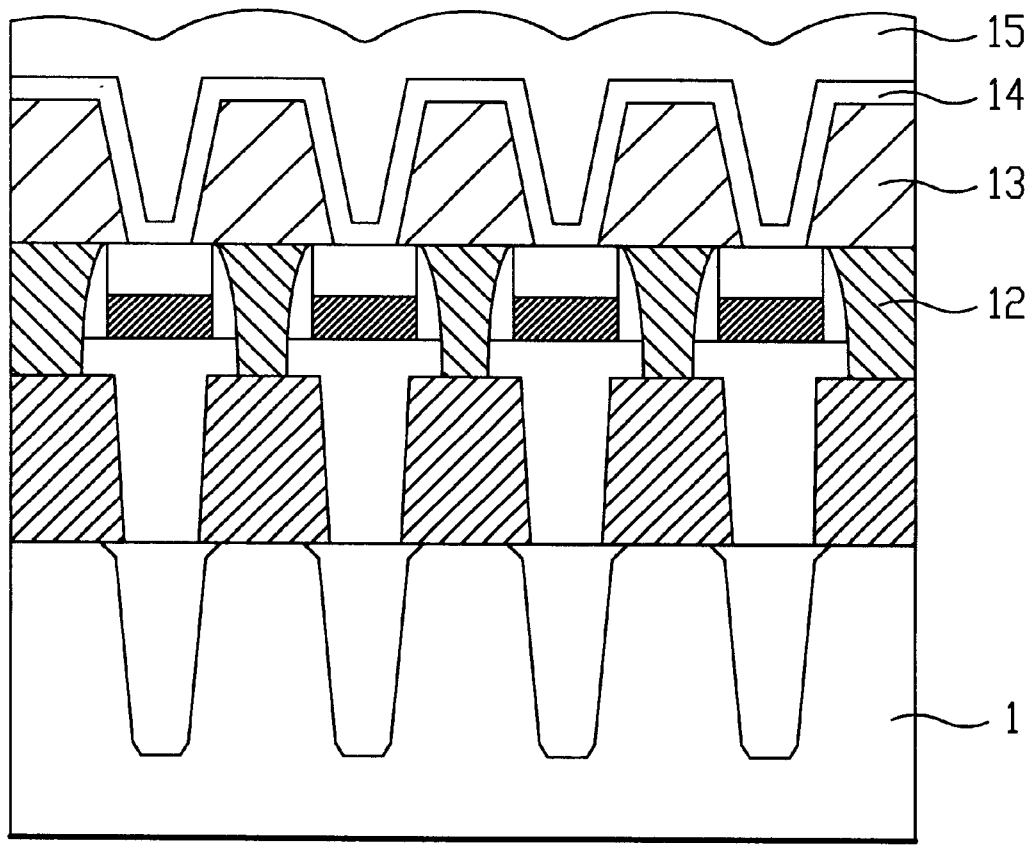
Figure 3D:
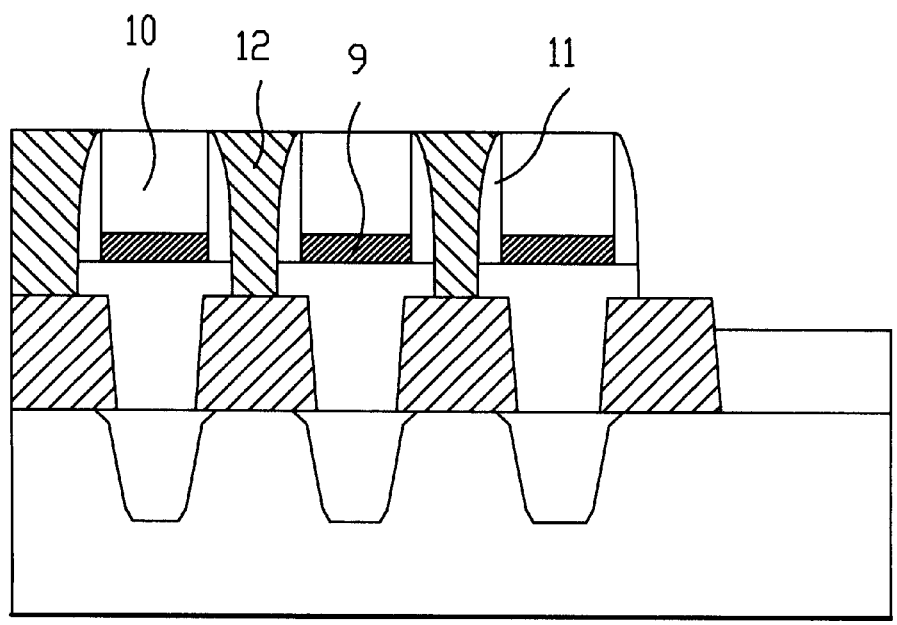

As shown in FIGS. 1d and 3d, the tungsten layer 9a and the oxide film 10a are subjected to patterning with a photo etching process, thus forming a bitline 9 and a cap insulating film 10 in a direction perpendicular to the wordline 4. Then, an insulating film is disposed on an entire surface and etched back, to form insulating sidewalls 11 at both sides of the bitline 9. A slight overetch of the insulating film is made in the etch-back of the insulating film to remove the interlayer insulating film 7 on the first plugs 6 and 6a and to expose surfaces of the first plugs 6 and 6a. Polysilicon is deposited on the entire surface, selectively removed to expose a surface of the cap insulating film 10 on the bitlines 9, and subjected to patterning by photo etching to leave the polysilicon only on the first plugs 6, thus forming second plugs 12.

Figure 3E:
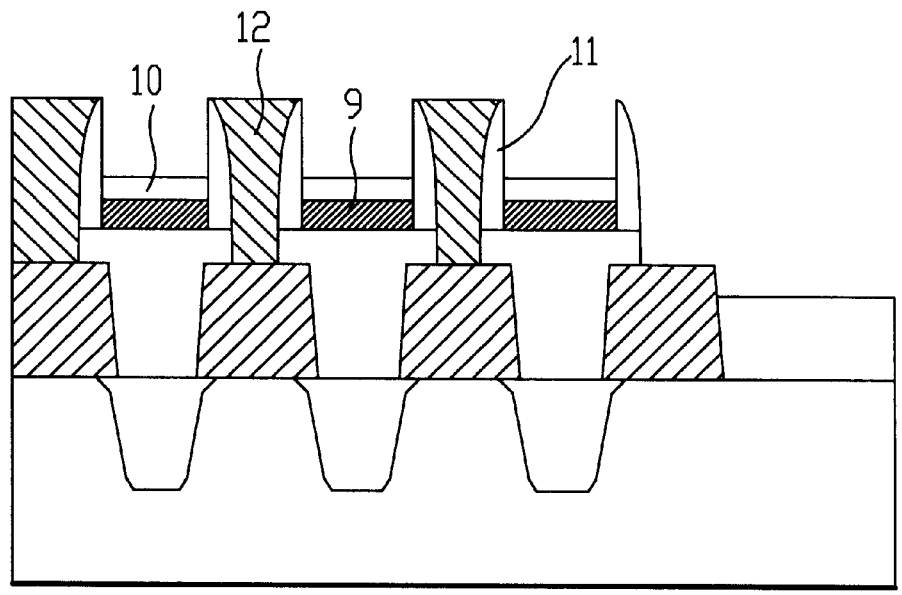
Figure 3F:
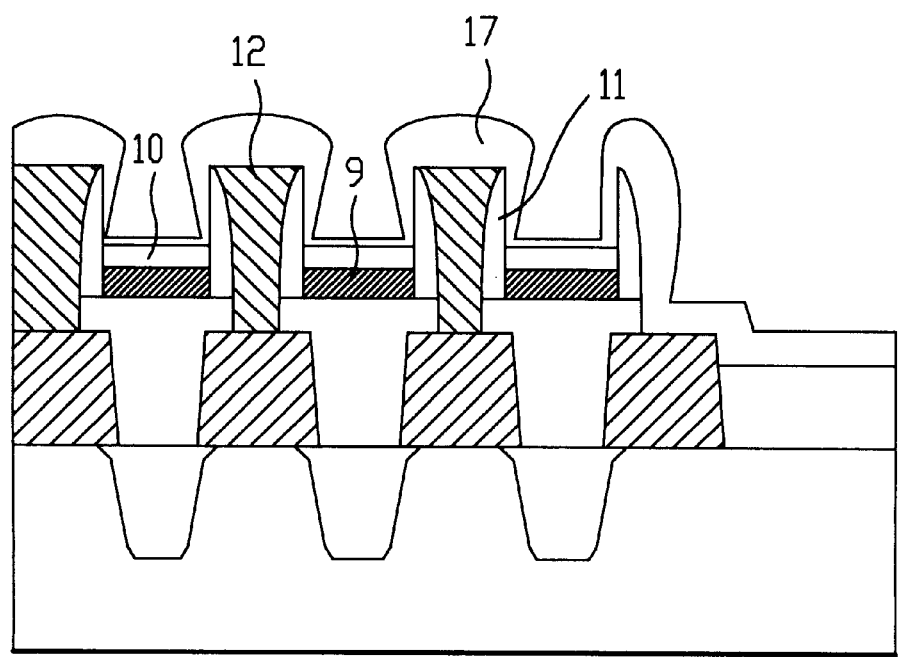
Figure 3G:
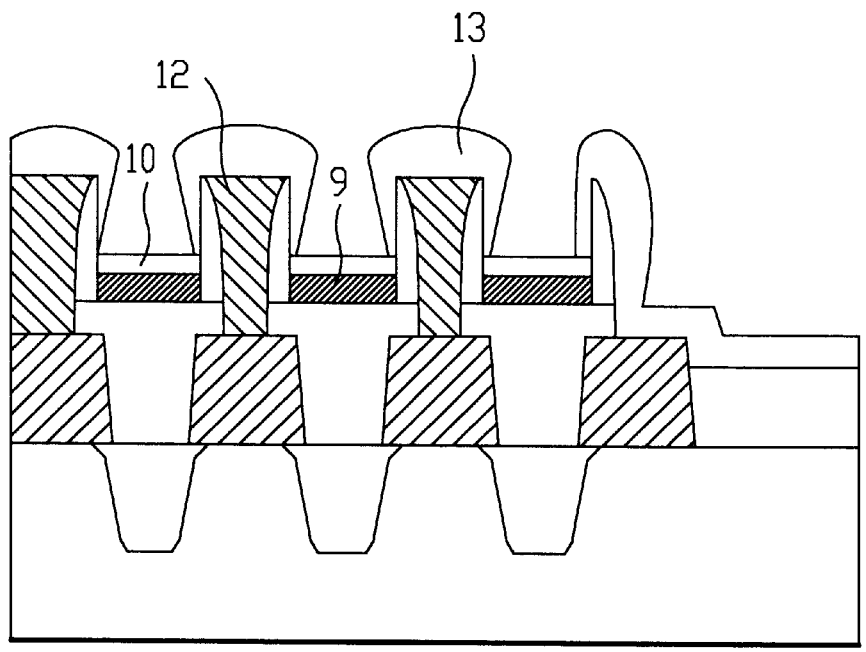
Figure 3H:
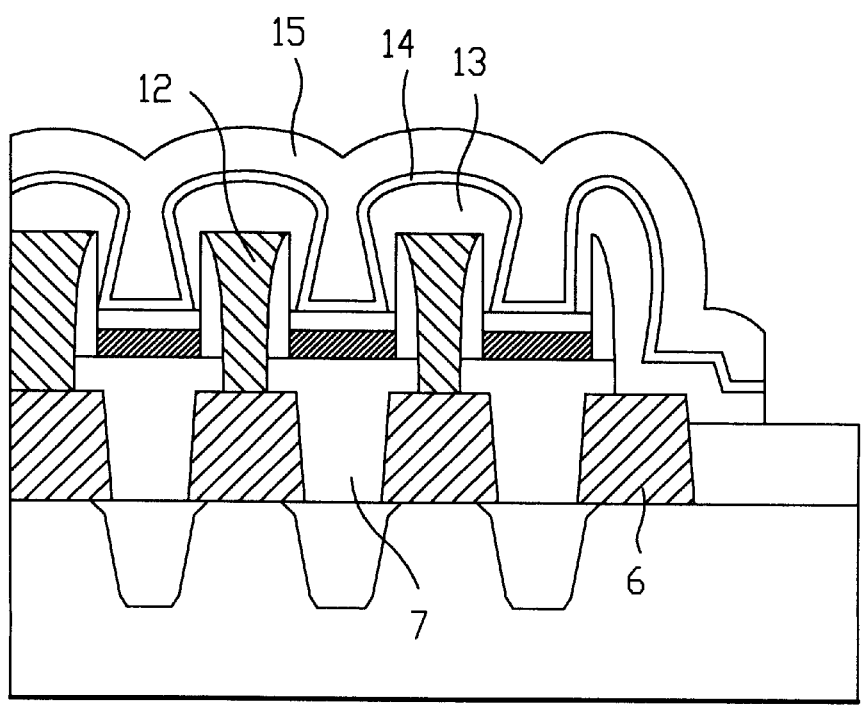

As shown in FIG. 3e, the cap insulating film 10 on the bitline 9 is etched to a required depth. That is, by conducting a dry or wet etching within a range so that the bitline 9 is not exposed, the cap insulating film 10 is partially removed. As shown in FIG. 3f, a conductive layer 17 is sputtered on the entire surface and is to be used to form a storage electrode of a capacitor. As the conductive layer 17 is sputtered, the conductive layer 17 is formed thicker on the second plug 12. As shown in FIG. 3g, the conductive layer 17 is then etched by a reactive ion etching (RIE) to form storage nodes 13 having nodes separated between cells. As shown in FIG. 3h, a dielectric film 14 is formed on a surface of the capacitor storage electrode 13, and a plate electrode 15 is formed on the dielectric film 14, thus completing the capacitor.

The method for fabricating a capacitor in a DRAM cell in accordance with the present invention has the following advantages. The present invention fabricates the capacitor storage electrode by sputtering a conductive layer and then subjecting the conductive layer to an anisotropic etching. This simplifies the fabrication process when compared to the related art process of forming the capacitor storage electrode by a photo etching process.

It will be apparent to those skilled in the art that various modifications and variations can be made in the method for fabricating a capacitor in a DRAM cell of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor in a DRAM cell, comprising the steps of:

forming a plurality of wordlines each having a first cap insulating film on a semiconductor substrate;

forming source/drain impurity regions in an active region of the semiconductor substrate on both sides of each of the wordlines;

forming first sidewall insulating films at the both sides of said each of the wordlines;

forming first plugs for contacting either capacitor nodes or bitlines on each of the source/drain impurity regions;

forming an interlayer insulating film on the semiconductor substrate and forming a contact hole therein to the first plugs for contacting the bitlines;

forming a plurality of bitlines in a direction perpendicular to the wordlines, each of the bitlines being in contact with the first plugs, and having a second cap insulating film;

forming second sidewall insulating films at both sides of each of the bitlines and selectively removing the interlayer insulating film to expose surfaces of the first plugs;

forming second plugs on the first plugs for contacting the capacitor nodes;

removing the second cap insulating film to a required depth;

forming capacitor storage electrodes on the second plugs and the second sidewall insulating films, wherein the capacitor storage electrodes are formed by sputtering a conductive layer on an entire surface of the semiconductor substrate and anisotropically etching the conductive layer to remove the conductive layer on the second cap insulating films; and forming a dielectric film and a plate electrode on the semiconductor substrate.

2. The method as claimed in claim 1, wherein the step of forming first plugs includes the steps of:

depositing a polysilicon layer on an entire surface of the semiconductor substrate, removing the polysilicon layer by chemical mechanical polishing to expose a surface of the first cap insulating film on the wordlines, and patterning the polysilicon layer by photolithography to leave the polysilicon layer only on the source/drain regions, thus forming the first plugs.

3. The method as claimed in claim 1, further comprising the step of forming a silicide layer on a surface of the first plugs.

4. The method as claimed in claim 1, wherein the step of forming second plugs includes the steps of:

depositing a polysilicon layer on an entire surface of the semiconductor substrate;

removing the polysilicon layer by chemical mechanical polishing to expose a surface of the second cap insulating film on the bitlines to leave the polysilicon layer only in regions between the bitlines, and patterning the polysilicon layer by photolithography to leave the polysilicon layer only on the first plugs for contacting the capacitor nodes, thereby forming the second plugs.

5. The method as claimed in claim 1, wherein the anisotropic etching of the conductive layer is done by a reactive ion etching.

6. The method as claimed in claim 1, wherein the step of forming a plurality of bitlines includes the steps of:

depositing a tungsten layer and a thick oxide film sequentially on an entire surface of the semiconductor substrate; and patterning the tungsten layer and the thick oxide film with a photo etching process to form the plurality of bitlines with the thick oxide layer serving as the second cap insulating film.

7. A method for fabricating a capacitor in a DRAM cell, comprising the steps of:

forming a plurality of wordlines on a substrate;

forming a plurality of first polysilicon plugs on an active region of the substrate between the plurality of wordlines;

forming a plurality of bitlines in a direction perpendicular to the plurality of wordlines, each of the bitlines being in contact with at least one of the plurality of the first polysilicon plugs;

forming a plurality of second polysilicon plugs on the plurality of first polysilicon plugs;

forming capacitor storage electrodes on the second polysilicon plugs, wherein the capacitor storage electrodes are formed by sputtering a conductive layer on the substrate and anisotropically etching the conductive layer; and forming a dielectric film and a plate electrode on the substrate.

8. The method as claimed in claim 7, further comprising the step of forming a silicide layer on a surface of the first polysilicon plugs.

9. The method as claimed in claim 7, wherein the step of anisotropically etching the conducting layer is done by a reactive ion etching process.

10. The method as claimed in claim 7, wherein the step of forming a plurality of bitlines includes the steps of:

depositing a tungsten layer and a thick oxide film sequentially on an entire surface of the substrate; and patterning the tungsten layer and the thick oxide film with a photo etching process to form the plurality of bitlines with a cap insulating film thereon.

* * * * *